United States Patent
Ao et al.

(10) Patent No.: US 9,385,408 B2
(45) Date of Patent: Jul. 5, 2016

(54) REDUCED BACKDRILLING WITH QUARTER WAVELENGTH TRANSMISSION LINE STUBS

(71) Applicant: Lenovo Enterprise Solutions (Singapore) Pte. Ltd., Singapore (SG)

(72) Inventors: Eric R. Ao, Nepean (CA); Donald R. Dignam, Ottawa (CA); Stephen J. Flint, Ottawa (CA); Jian Meng, Kanata (CA)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 120 days.

(21) Appl. No.: 14/135,210

(22) Filed: Dec. 19, 2013

(65) Prior Publication Data

US 2015/0180104 A1 Jun. 25, 2015

(51) Int. Cl.
| | |
|---|---|
| H01P 1/203 | (2006.01) |
| G06F 17/50 | (2006.01) |
| H05K 1/11 | (2006.01) |
| H05K 3/00 | (2006.01) |
| H05K 1/02 | (2006.01) |
| H05K 3/42 | (2006.01) |

(52) U.S. Cl.
CPC .......... *H01P 1/2039* (2013.01); *H05K 1/0248* (2013.01); *H05K 1/116* (2013.01); *H05K 3/0005* (2013.01); *H05K 1/024* (2013.01); *H05K 3/429* (2013.01); *H05K 2201/0187* (2013.01)

(58) Field of Classification Search
CPC ................................................... H01P 1/2039
USPC ............................................................ 333/33
See application file for complete search history.

(56) References Cited

U.S. PATENT DOCUMENTS

| | | | |
|---|---|---|---|
| 6,859,115 B1 | 2/2005 | Hirsch et al. | |
| 7,579,925 B2 | 8/2009 | Fan et al. | |
| 8,115,110 B2 | 2/2012 | Khilchenko et al. | |
| 8,390,393 B2 | 3/2013 | Bandholz et al. | |
| 2001/0024117 A1* | 9/2001 | Kiyokawa | G01R 31/2603 324/76.49 |
| 2004/0136169 A1* | 7/2004 | Morimoto | H05K 1/023 361/780 |
| 2005/0105906 A1* | 5/2005 | Barbosa | H04J 14/0298 398/54 |
| 2010/0126010 A1 | 5/2010 | Puzella et al. | |
| 2012/0211273 A1 | 8/2012 | Kuczynski et al. | |
| 2012/0282749 A1 | 11/2012 | Gaucher et al. | |
| 2014/0077896 A1* | 3/2014 | Lee et al. | 333/185 |

OTHER PUBLICATIONS

Dudnikov, et al., "Matched Terminated Stub VIA Technology for Higher Bandwidth Transmission in Line Cards and Back Planes". 2008 Sanmina-SCI.
"PTH Via Semi-Loop to Reduce the Capacitive Effect of the Long Via Stub". IP.com Prior Art Database Technical Disclosure. IPCOM000223139D. Nov. 5, 2012.

* cited by examiner

*Primary Examiner* — Stephen E Jones
*Assistant Examiner* — Scott S Outten
(74) *Attorney, Agent, or Firm* — Zilka-Kotab, PC

(57) ABSTRACT

Embodiments of the present invention provide for a transmission line stub that includes a via stub of a conductive via. The conductive via includes a via stub and a coupling element, wherein a first transmission line configured to transmit a signal is coupled to the conductive via at the intersection of the via stub and the coupling element. The coupling element is configured to transmit the signal from the first transmission line. A line stub electrically coupled to the via stub, wherein the length of the line stub is selected such that the transmission line stub having a length of the sum of the lengths of the via stub and the line stub is configured to suppress a preselected frequency.

14 Claims, 4 Drawing Sheets

REDUCED BACKDRILLING WITH QUARTER WAVELENGTH TRANSMISSION LINE STUBS

FIELD OF THE INVENTION

The present invention relates generally to high speed digital circuit technology, and more particularly to printed circuit board technology used in high speed circuits.

BACKGROUND

A printed circuit board (PCB) mechanically supports and electrically connects various electronic components and connectors using conductive traces, pads and other features etched from, for example, copper sheets laminated onto a non-conductive substrate of a dielectric material. PCB's can be single sided (one copper layer), double sided (two copper layers) or multi-layer. Multi-layer PCB's may typically use multiple cores that include two patterned conductive layers and a central dielectric layer that are laminated together forming a composite structure. The conductors on different layers are electrically connected with vias. There are several types of vias utilized in traditional PCB design, such as, plated through holes (PTH), buried vias, and blind vias, which are standard for PCB design. A PTH utilizes a drilled hole extending through the composite structure and is typically plated with a conductor, such as copper, providing electrical continuity between the various conductive elements of a circuit.

High speed circuit boards traditionally utilize multi-layer structures that include ground planes, voltage planes and transmission lines that can be interconnected between layers by electrically conductive vias. While necessary in multi-layer PCB's to connect the various signal lines and planes in different PCB layers, vias can be discontinuities for high speed signal transmission causing signal reflections and degradation of the signal integrity. Portions of a conductive via extending beyond the interconnected inner layers of the PCB can form an unterminated via stub. The presence of these unterminated stubs in high speed circuits can act to produce undesirable signal reflections leading to signal degradation. Back drilling is a process used to remove most of the unwanted stubs by mechanically drilling the unused portion of the PTH to a certain depth with a larger diameter hole. The process of back drilling increases the manufacturing cost to produce the PCB as a result of the additional process steps and possible reduced yield. In addition, the via is no longer electrically accessible with test equipment after the backdrilling process.

SUMMARY

Embodiments of the present invention provide for a transmission line stub that includes a via stub of a conductive via. The conductive via includes a via stub and a coupling element, wherein a first transmission line configured to transmit a signal is coupled to the conductive via at the intersection of the via stub and the coupling element. The coupling element is configured to transmit the signal from the first transmission line. A line stub electrically coupled to the via stub, wherein the length of the line stub is selected, such that the transmission line stub having a length of the sum of the lengths of the via stub and the line stub is configured to suppress a preselected frequency.

Embodiments of the present invention also provide a method and a computer program product for designing a transmission line stub that includes a via stub of a conductive via. The method comprises creating a physical layout. A length of a via stub of a conductive via is determined, wherein the conductive via includes the via stub and a coupling element, wherein a first transmission line configured to transmit a signal is coupled to the conductive via at the intersection of the via stub and the coupling element. The coupling element is configured to transmit the signal from the first transmission line. A length of a line stub, electrically coupled to the via stub is determined, such that the transmission line stub having a length of the sum of the lengths of the via stub and the line stub is configured to suppress a preselected frequency. The line stub is added to the via stub in the physical layout.

DETAILED DESCRIPTION

Figure 1:
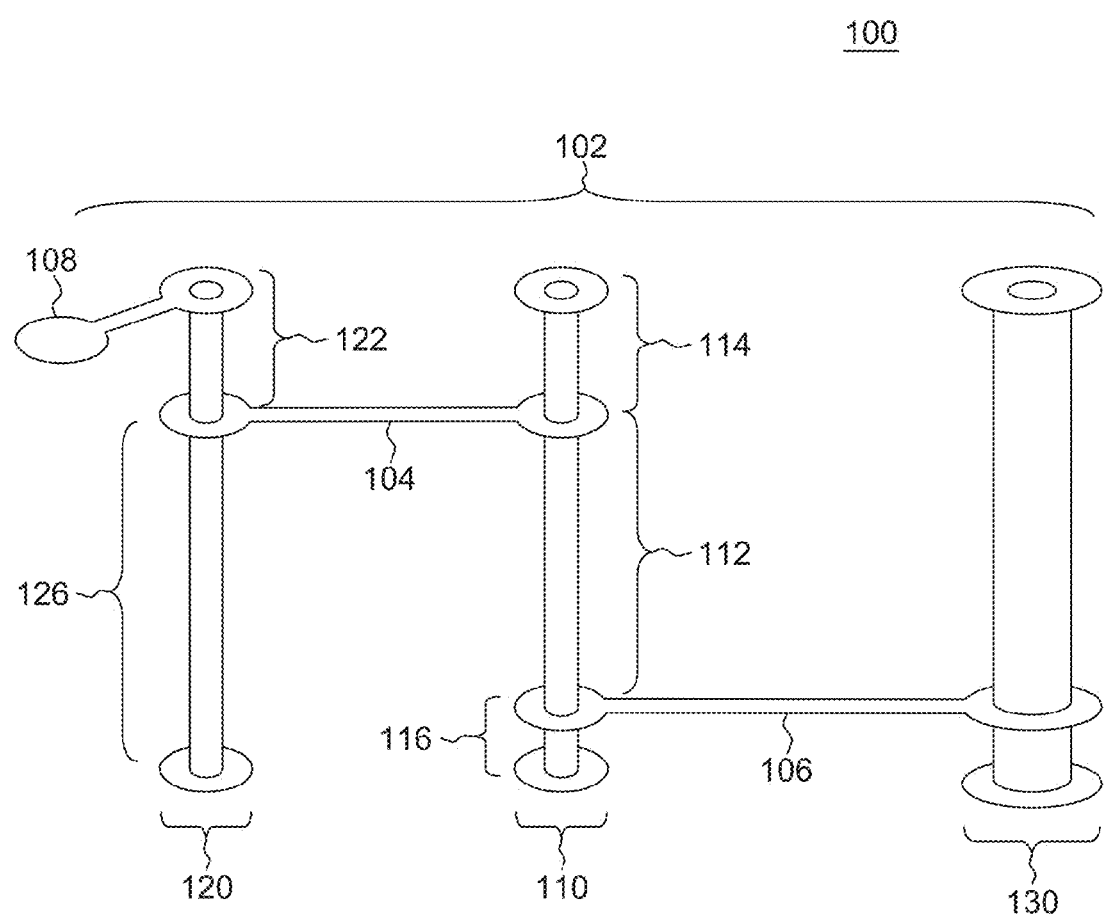
FIG. 1 illustrates a circuit formed in a printed circuit board.

Embodiments of the present invention generally provide a transmission line stub, added to an unterminated via stub, reducing undesirable signal reflection and signal degradation and removing the need to backdrill to achieve the same result. The present invention may be performed in manual design environments, or in electronic design automation (EDA) environments. Detailed description of embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

Printed circuit board technology typically consists of a non-conducting dielectric layer on which a conductive layer may be laminated or deposited. A typical example is an epoxy impregnated glass cloth or similar dielectric material laminated with one or more layers of copper. Signal or transmission lines, and power or ground planes may be etched or selectively plated on the layers. One or more layers of insulating and conductive materials that include transmission lines and/or power or ground planes may be laminated together forming a composite structure of the printed circuit board. Via holes may be drilled through the composite structure and filled or plated with a conductive material, such as silver filled epoxy, copper plating, or other conductive material, to make electrical connections between transmission lines included on different layers of the printed circuit board.

A designer creates a physical design or PCB layout using, for example, a netlist, electrical performance requirements, and manufacturing guidelines. This may also be referred to as a physical design layout. Typically, a designer can use specialized computer software program, such as Allegro® PCB Design by Cadence® Design Systems, as a design tool to generate the physical design layout. The design tool can also be used to identify unterminated via stubs within the physical design layout.

Referring now to the figures, FIG. 1 illustrates circuit 102 formed in printed circuit board 100. Circuit 102 includes transmission lines 104 and 106, and termination pad 108, formed on different layers of printed circuit board 100. Circuit 102 further comprises via holes 110, 120, and 130 formed by drilling holes through printed circuit board 100 and through transmission lines 104 and/or 106 and/or termination pad 108. In various embodiments, the sidewalls of via holes 110, 120, and 130 are plated with an electrically conductive material, such as copper, and typically referred to as a plated through hole (PTH). The electrically conductive material on the sidewall of via hole 110 provides electrical coupling, interconnecting transmission line 104 and transmission line 106. The electrically conductive material on the sidewall of via hole 120 provides electrical coupling, interconnecting transmission line 104 and termination pad 108, located on the top surface of printed circuit board 100. In various embodiments, the electrically conductive material on the sidewall of via hole 130 provides electrical coupling to a connector (not shown). The connector may be soldered to the conductive material on the sidewall of via hole 130, or it may be a mechanical attachment, such as, a compliant pin connector.

Via hole 110 includes three segments; coupling element 112, upper via stub 114, and lower via stub 116. Coupling element 112 provides electrical coupling between transmission line 104 and transmission line 106 of circuit 102. Upper via stub 114, the portion of via hole 110 located above transmission line 104, is an unterminated circuit element electrically coupled to circuit 102. The length of upper via stub 114 is dependent on the location of transmission line 104 within printed circuit board 100 and can be determined by the thickness of the various layers above transmission line 104. Similarly, lower via stub 116, the portion of via hole 110 located below transmission line 106, is an unterminated circuit element electrically coupled to circuit 102. The length of lower via stub 116 is dependent on the location of transmission line 106, within the printed circuit board, and can be determined by the thickness of the various layers below transmission line 106.

Via hole 120 includes two segments, coupling element 122 and lower via stub 126. Coupling element 122 provides electrical coupling between transmission line 104 and termination pad 108. Lower via stub 126, the portion of via hole 120 located below transmission line 104, is an unterminated circuit element electrically coupled to circuit 102. The length of lower via stub 126 is dependent on the location of transmission line 104 within the printed circuit board and can be determined by the thickness of the layers below transmission line 104.

An unterminated via stub can act as a discontinuity in a circuit causing signal reflection and degrading signal integrity. The maximum allowable stub length can be determined based on a circuit simulation using a computer simulation program. PCB electrical circuit simulation uses, for example, the frequency, data rate, and performance objectives to predict electrical circuit performance. Computer software programs, such as HFSS™ by Ansys Corporation can be used to calculate PCB scattering parameters (S-parameters) that analyze the effect of impedance discontinuities on a transmission line. Effects such as insertion loss and return loss due to an unterminated via stub or other discontinuity on a PCB circuit can be calculated. A PCB designer can use the circuit simulation results to determine a maximum length of an unterminated via stub for a specific design application based on, without limitation, frequency, data rate, signal integrity requirements, and cost objectives. Unterminated via stubs that exceed the maximum allowable length can be removed by backdrilling, a process that includes removing most of the unterminated via stub by drilling an oversized hole using a controlled depth drilling process. In various embodiments of the invention, unterminated via stubs can be extended with the addition of an unterminated circuit trace or line stub as describes below with reference to FIG. 2.

Figure 2:
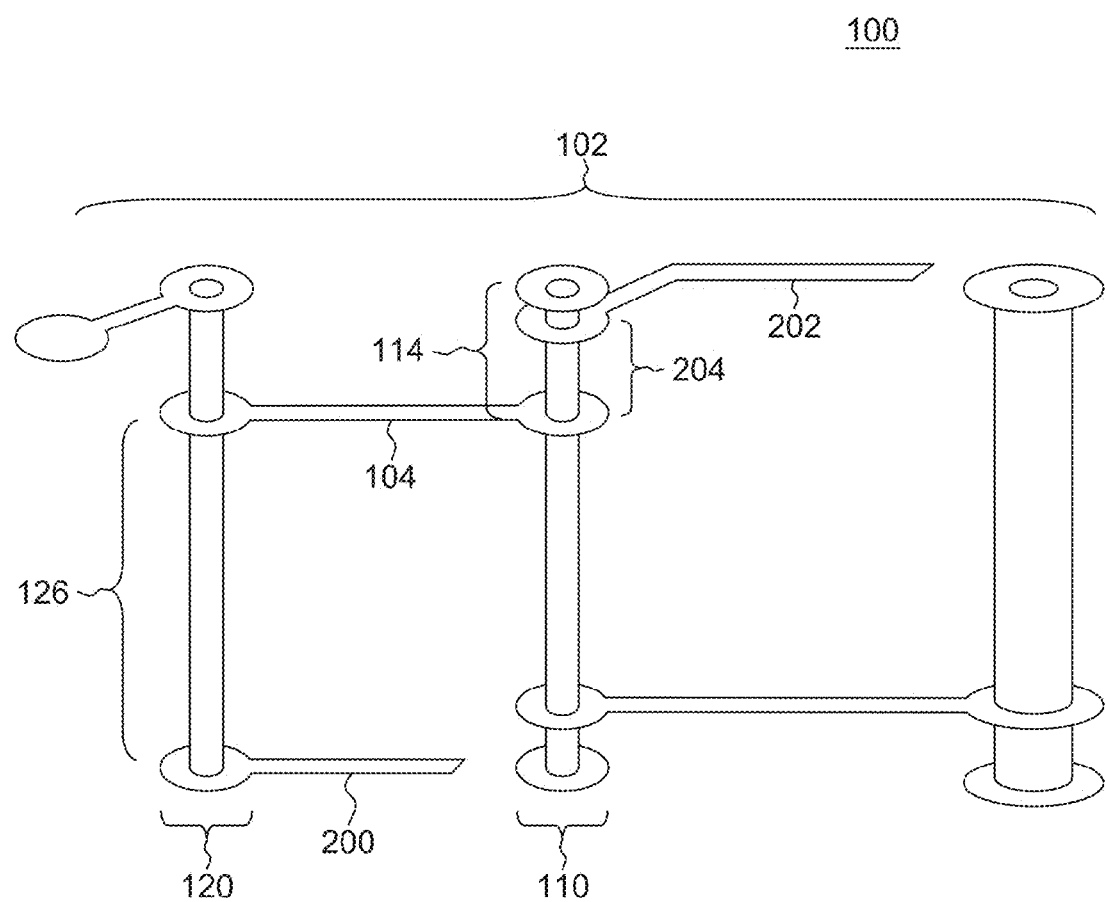
FIG. 2 illustrates the addition of line stubs to the circuit formed in the printed circuit board of FIG. 1 in accordance with an embodiment of the invention.

FIG. 2 illustrates the addition of line stubs 200 and 202 to circuit 102 formed in printed circuit board 100 of FIG. 1 in accordance with an embodiment of the invention. In various embodiments, line stub 200 is an unterminated circuit trace on the surface of printed circuit board 100, electrically attached to lower via stub 126, and acts to extend the length of lower via stub 126 such that the sum of the lengths of line stub 200 and lower via stub 126 equals one quarter of the electrical wavelength of the second harmonic of the fundamental transmission line frequency. It should be appreciated by someone skilled in the art that lower via stub 126 and line stub 200 may be surrounded by different materials with different effective dielectric constants. The dielectric constant of the surrounding material affects the propagation speed of a transmitted signal. Thus, the propagation speed can be considered when composing the transmission line stub. As such, the lengths of lower via stub 126 and line stub 200 can be determined based on the time delay of each segment wherein the sum of the time delay of each segment equals one quarter cycle of the second harmonic of the fundamental frequency. Computer software programs such as HFSS™ can calculate the time delays associated with lower via stub 126 and line stub 200. The fundamental frequency of the transmission line can be determined as one half of the data rate on that transmission line. For example, if the data rate on a transmission line in 10 gigabits per second (Gbps), the fundamental frequency is 5 GHz. Alternatively, the fundamental frequency is equal to the inverse of the period of a clock signal, if the transmission line carries a clock signal rather than data. The second harmonic frequency is determined as twice the fundamental frequency. For example, the second harmonic frequency of a 5 GHz signal transmission is 10 GHz. The electrical wavelength is based on the frequency of a signal transmission and the dielectric constant of the material(s) surrounding the circuit trace according to the equation:

$$\lambda = C/(f \times \sqrt{Er\ Eff})$$

where C=the speed of light in vacuum, f=frequency, and Er Eff=the effective dielectric constant. In various embodiments, the frequency used in this equation is the second harmonic frequency. In various embodiments, an unterminated line stub can suppress frequencies having an electrical wavelength that is four times the length of the unterminated line stub (i.e., the unterminated stub length is one quarter of the electrical wavelength of the transmitted, suppressed frequency). Selecting the length of line stub 200, such that the sum of the lengths of lower via stub 126 and line stub 200, based on the time delay of each segment, substantially equals one quarter cycle of the second harmonic of the fundamental transmission line frequency, and can operate to suppress the energy around the second harmonic frequency of the transmitted frequency.

In various embodiments, line stub 202 is an unterminated circuit trace on a signal plane near the surface of printed circuit board 100, and is electrically attached to upper via stub 114. Length 204 is determined as the thickness of printed circuit board 100 between transmission line 104 and line stub 202. Line stub 202 acts to extend the length of the portion of upper via stub 114 between transmission line 104 and line stub 202 such that the sum of the time delays of length 204 and line stub 202 substantially equals one quarter cycle of the second harmonic of the fundamental transmission line frequency, as determined above. It should be appreciated by someone skilled in the art that the electrical wavelength for line stub 202 can be calculated as a microstrip, and the electrical wavelength for line stub 202 can be calculated as a stripline.

In other embodiments, an unterminated via, such as lower via stub 126, can be extended by attaching a wire (not shown) to the unterminated via. The wire may be attached by, for example, soldering an end of the wire to the surface land of the unterminated via. It should be appreciated by someone skilled in the art that the electrical wavelength for the attached wire may be calculated using an effective dielectric constant of one (dielectric constant of air). The total length of stubs may be determined in time delay, which is quarter cycle of the second harmonic of the fundamental frequency.

As will be appreciated by one skilled in the art, aspects of the present invention may be embodied as a method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer-readable medium(s) having computer readable program code/instructions embodied thereon.

Any combination of computer-readable media may be utilized. Computer-readable media may be a computer-readable signal medium or a computer-readable storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of a computer-readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device.

Program code embodied on a computer-readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java™, Smalltalk, C++ or the like and conventional procedural programming languages, such as the "C" programming language or similar programming languages. The program code may execute entirely on a user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer, other programmable data processing apparatus, or other devices to function in a particular manner, such that the instructions stored in the computer-readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer-implemented process such that the instructions which execute on the computer or other programmable apparatus provide processes for implementing the functions/acts specified in the flowchart and/or block diagram block or blocks.

Implementation of embodiments of the invention may take a variety of forms, and exemplary implementation details are discussed subsequently with reference to the Figures. The embodiment illustrated in the Figures describes the interaction of a software product help system and annotated help files. Specific details disclosed herein are not to be interpreted as limiting, but merely as a representative basis for teaching one skilled in the art to variously employ the methods and structures of the present disclosure.

As will be appreciated by one skilled in the art, aspects of the present invention may be embodied as a method or system. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

As used herein, "logic" such as control logic, can be a sequence of steps required to perform a specific function, and, in an embodiment, is implemented through hardwired computer circuits and other hardware or, alternatively, firmware, such as low-level program instructions stored on a read only memory (ROM) and executed by one or more control circuits.

As used herein, a "computer processor," or "microprocessor," can be a semiconductor chip that resides in computers, smart phones, and other electronic devices. A microprocessor can contain integrated circuits and other sequential digital logic components. The basic job of the computer processor is to receive input and provide the appropriate output by interpreting and executing commands from the computer's hardware and software.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It may be further understood that the terms "comprises" or "comprising," when used in this specification, specify the presence of stated features, integers, steps, operations, elements, or components, but do not preclude the presence or addition of one or more other features, integers, steps, operations, elements, components, or groups thereof.

The descriptions of the various embodiments of the present invention have been presented for purposes of illustration, but are not intended to be exhaustive or limited to the embodiments disclosed. Many modifications and variations may be apparent to those of ordinary skill in the art without departing from the scope and spirit of the described embodiments. Thus, the present invention is not limited to the embodiments shown, but is to be accorded the widest scope consistent with the principles and features disclosed herein.

Implementation of embodiments of the invention may take a variety of forms, and exemplary implementation details are discussed subsequently with reference to the Figures. The embodiment illustrated in the Figures describes an apparatus to recover digital signal transmissions. Specific details disclosed herein are not to be interpreted as limiting, but merely as a representative basis for teaching one skilled in the art to variously employ the methods and structures of the present disclosure.

Figure 3:
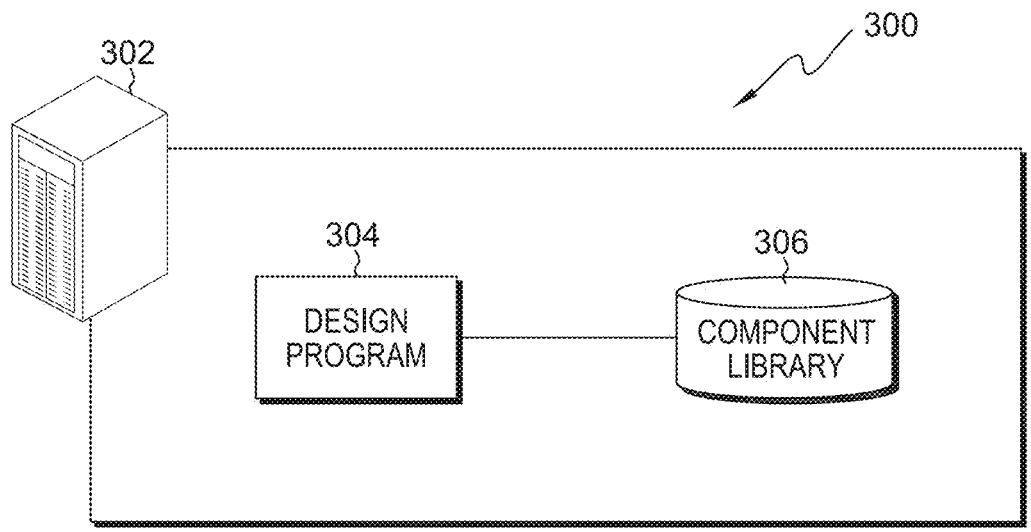
FIG. 3 is a block diagram illustrating an electronic design automation (EDA) environment in accordance with an embodiment of the invention.

FIG. 3 is a block diagram illustrating an electronic design automation (EDA) environment, generally designated 300, in accordance with one embodiment of the present invention. In one embodiment, EDA environment 300 includes computer 302 which comprises design program 304 and component library 306.

Computer 302 may be a specialized server computer, a laptop computer, a tablet computer, a netbook computer, a personal computer (PC), a desktop computer, a personal digital assistant (PDA), a smart phone, or any programmable electronic device. In certain embodiments, computer 302 represents a computer system utilizing clustered computers and components that act as a single pool of seamless resources when accessed through a network, as is common in data centers and with cloud computing applications. In general, computer 302 is representative of any programmable electronic device or combination of programmable electronic devices capable of executing machine-readable program instructions and communicating with other computing devices via a network. Exemplary components of computer 302 are described in greater detail with regard to FIG. 5.

Design program 304 may be any automated PCB design and analysis software, customized PCB design software, or manual PCB design software with a connection to component library 306. Design program 304 has the capability to perform all aspects of the design flow including, but not limited to, logic synthesis, placement, routing, analysis, and sign-off. Design program 304 may be a collection of circuit design software tools that are partially or fully integrated into a single software package, or each tool may be completely separate software programs. Design program 304 is capable of creating a physical design layout. Component library 306 may be a standard library, or customized library which comprises a collection of, without limitation, component foot prints, placement models, via models, and connectors. Component library 306 may be fully integrated, partially integrated or completely separate from design program 304.

In an alternate embodiment of the present invention, EDA environment 300 is replaced with a manual PCB design environment, wherein PCB designs are created graphically without automation.

Figure 4:
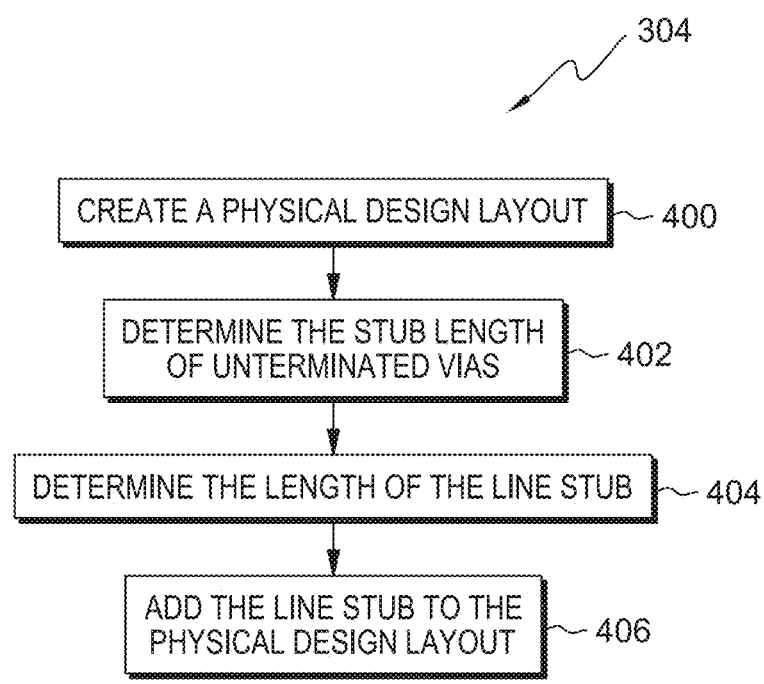
FIG. 4 is a flow chart illustrating the design steps to extend an unterminated via by a design program in accordance with an embodiment of the invention.

FIG. 4 is a flow chart illustrating the design steps to extend an unterminated via by design program 304 in accordance with an embodiment of the invention. Design program 304 creates a physical design layout of a PCB (Step 400). A PCB designer may input parameters such as, without limitation, PCB stack up structure, second harmonic frequency, target impedance, copper width, copper thickness, dielectric thickness, and dielectric constant. Design program 304 then determines the stub length of unterminated vias (step 402). In various embodiments, design program 304 identifies the unterminated vias in the physical design and, based on cross-sectional information, such as the number of layers and the layer thicknesses, determines the length of the unterminated portion of the via. The design program 304 can then determine the length of the line stub to be added to the unterminated via (Step 404). The sum of the time delays associated with the lengths of the unterminated portion of the via and the added line stub substantially equals one quarter cycle of the second harmonic of the fundamental transmission line frequency. Having determined the length of the line stub, the design program 304 adds the line stub in the physical design (Step 406).

Figure 5:
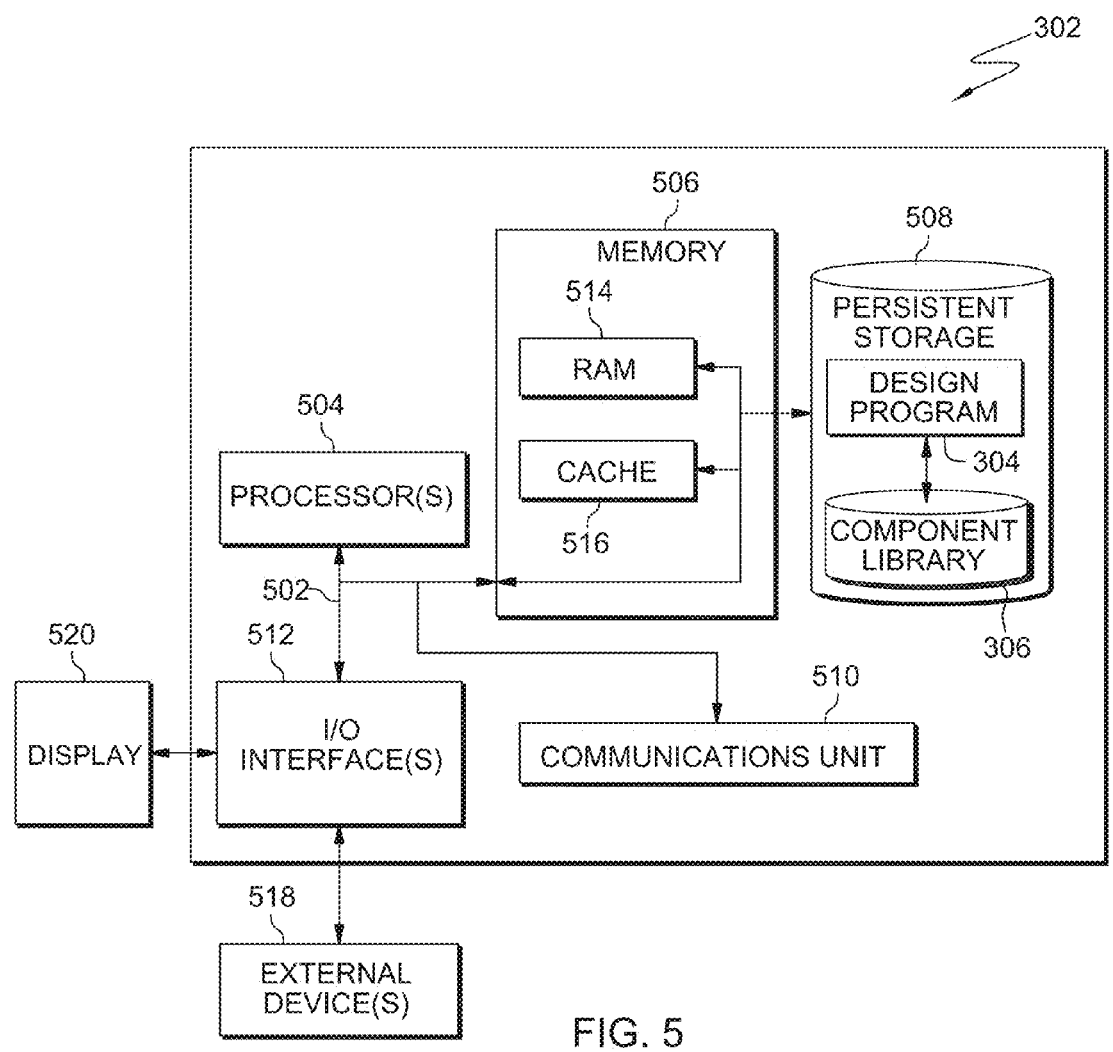
FIG. 5 depicts a block diagram of components of a computer in accordance with an embodiment of the invention.

FIG. 5 depicts a block diagram of components of computer 302 in accordance with an illustrative embodiment of the present invention. It may be appreciated that FIG. 5 provides only an illustration of one implementation and does not imply any limitations with regard to the environments in which different embodiments may be implemented. Many modifications to the depicted environment may be made.

Computer 302 includes communications fabric 502, which provides communications between computer processor(s) 504, memory 506, persistent storage 508, communications unit 510, and input/output (I/O) interface(s) 512. Communications fabric 502 can be implemented with any architecture designed for passing data and/or control information between processors (such as microprocessors, communications and network processors, etc.), system memory, peripheral devices, and any other hardware components within a system. For example, communications fabric 502 can be implemented with one or more buses.

Memory 506 and persistent storage 508 are computer-readable storage media. In this embodiment, memory 506 includes random access memory (RAM) 514 and cache memory 516. In general, memory 506 can include any suitable volatile or non-volatile computer-readable storage media.

Design program 304, and component library 306 are stored in persistent storage 508 for execution and/or access by one or more of the respective computer processors 504 via one or more memories of memory 506. Design program 304 has access to component library 306. In this embodiment, persistent storage 508 includes a magnetic hard disk drive. Alternatively, or in addition to a magnetic hard disk drive, persistent storage 508 can include a solid state hard drive, a semiconductor storage device, read-only memory (ROM), erasable programmable read-only memory (EPROM), flash memory, or any other computer-readable storage media that is capable of storing program instructions or digital information.

The media used by persistent storage 508 may also be removable. For example, a removable hard drive may be used for persistent storage 508. Other examples include optical and magnetic disks, thumb drives, and smart cards that are inserted into a drive for transfer onto another computer-readable storage medium that is also part of persistent storage 508.

Communications unit 510, in these examples, provides for communications with other data processing systems or devices, including resources of computer 302. In these examples, communications unit 510 includes one or more network interface cards. Communications unit 510 may provide communications through the use of either or both physical and wireless communications links. Design program 304, and component library 306 may be downloaded to persistent storage 508 through communications unit 510.

I/O interface(s) 512 allows for input and output of data with other devices that may be connected to computer 302. For example, I/O interface 512 may provide a connection to external device(s) 518 such as a keyboard, a keypad, a touch screen, and/or some other suitable input device. External device(s) 518 can also include portable computer-readable storage media such as, for example, thumb drives, portable optical or magnetic disks, and memory cards. Software and data used to practice embodiments of the present invention, e.g., design program 304 and component library 306, can be stored on such portable computer-readable storage media and can be loaded onto persistent storage 508 via I/O interface(s) 512. I/O interface(s) 512 also connect to a display 520.

Display 520 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Having described preferred embodiments of a transmission line stub based on one quarter of the electrical wavelength of the second harmonic frequency of a transmitted signal (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. A printed circuit board having a transmission line stub that includes a via stub of a conductive via, the printed circuit board comprising:

the conductive via having the via stub and a coupling element, the via stub extending to an outer surface of the printed circuit board;

a first transmission line configured to transmit a signal coupled to the conductive via at an intersection of the via stub and the coupling element, and wherein the coupling element is configured to transmit the signal from the first transmission line;

a line stub electrically coupled to the via stub, an upper surface of the line stub being below the outer surface of the printed circuit board, wherein a length of the line stub is selected such that the transmission line stub having a length including the sum of a length of the via stub and the length of the line stub, is configured to suppress a preselected frequency; and a second line stub coupled to a second via stub of a second conductive via, the second line stub being a wire attached to a surface land of the second conductive via, wherein the preselected frequency is a second harmonic of a fundamental frequency, wherein a first length of the via stub is defined between the transmission line and the line stub, the first length being less than a length of the via stub between the transmission line and an end of the line stub, wherein a sum of time delays of the line stub and the first length of the via stub is substantially equal to one quarter cycle of the second harmonic of the fundamental frequency, wherein the line stub is an unterminated circuit trace on a signal plane that is located below an outer insulating layer of the printed circuit board.

2. The printed circuit board of claim 1, wherein the preselected frequency is a second harmonic of a fundamental frequency.

3. The printed circuit board of claim 2, wherein the fundamental frequency is based on a data transmission rate for which the transmission line is designed, wherein a sum of time delays of the line stub and the via stub is substantially equal to one quarter cycle of the second harmonic of the fundamental frequency.

4. The printed circuit board of claim 2, wherein a first length of the via stub is defined between the transmission line and the line stub, the first length being less than a length of the via stub between the transmission line and an end of the line stub, wherein a sum of time delays of the line stub and the first length of the via stub is substantially equal to one quarter cycle of the second harmonic of the fundamental frequency.

5. The printed circuit board of claim 1, wherein the via stub is positioned in a first material having a first dielectric constant, wherein the line stub is positioned in a second material having a second dielectric constant, wherein the first dielectric constant is different than the second dielectric constant, wherein the first and/or second dielectric constant is determined based on a propagation speed of the signal.

6. The printed circuit board of claim 1, comprising a second line stub located on an outer surface of the printed circuit board.

7. The printed circuit board of claim 1, wherein the line stub is an unterminated circuit trace on a signal plane that is located below an outer insulating layer of the printed circuit board.

8. The printed circuit board of claim 1, wherein the conductive via is a plated through hole.

9. A method of designing a transmission line stub that includes a via stub of a conductive via, the method comprising:

creating a physical layout of a printed circuit board;

determining a designed length of a via stub of a conductive via, wherein the conductive via includes the via stub and a coupling element, the via stub extending to an outer surface of the printed circuit board, wherein a first transmission line designed to transmit a signal is coupled to the conductive via at the intersection of the via stub and the coupling element, and wherein the coupling element is designed to transmit the signal from the first transmission line;

determining a designed length of a line stub, electrically coupled to the via stub, such that the transmission line stub having a length of the sum of the lengths of the via stub and the designed line stub is configured to suppress a preselected frequency, an upper surface of the line stub being below the outer surface of the printed circuit board;

adding the line stub to the via stub in the physical layout;

determining a designed length of a second line stub coupled to a second via stub of a second conductive via, the second line stub being a wire attached to a surface land of the second conductive via, wherein the preselected frequency is a second harmonic of a fundamental frequency, wherein the designed length of the via stub is defined between the transmission line and the line stub, the designed length being less than a length of the via stub between the transmission line and an end of the line stub, wherein a sum of time delays of the line stub and the via stub is substantially equal to one quarter cycle of the second harmonic of the fundamental frequency, wherein the line stub is an unterminated circuit trace on a signal plane that is located below an outer insulating layer of the printed circuit board.

10. The method of claim 9, wherein the fundamental frequency is based on a data transmission rate for which the transmission line is designed.

11. The method of claim 9, wherein the line stub is a microstrip, or the line stub is a stripline.

12. The method of claim 9, wherein the designed length of the via stub is determined based on a location of the first transmission line in a printed circuit board having the transmission line stub and an amount of space separating the first transmission line and an outer surface of the printed circuit board.

13. The method of claim 9, wherein the conductive via is a plated through hole.

14. A computer program product for designing a transmission line stub, the computer program product comprising:

one or more computer-readable storage media and program instructions stored on the one or more non-transitory computer-readable media, the program instructions comprising:

program instructions to create a physical layout of a printed circuit board;

program instructions to determine a designed length of a via stub of a conductive via based on a first transmission line coupled to the conductive via at an intersection of the via stub and a coupling element of the conductive via, the via stub extending to an outer surface of the printed circuit board, wherein the coupling element is configured to transmit the signal from the first transmission line;

program instructions to determine a designed length of a line stub electrically coupled to the via stub, based on a preselected frequency, wherein a combined length of the via stub and the line stub is configured to suppress the preselected frequency, an upper surface of the line stub being below the outer surface of the printed circuit board;

program instructions to add the line stub to the via stub in the physical layout; and program instructions to determine a designed length of a second line stub coupled to a second via stub of a second conductive via, the second line stub being a wire attached to a surface land of the second conductive via, wherein the preselected frequency is a second harmonic of a fundamental frequency, wherein the designed length of the via stub is defined between the transmission line and the line stub, the designed length being less than a length of the via stub between the transmission line and an end of the line stub, wherein a sum of time delays of the line stub and the via stub is substantially equal to one quarter cycle of the second harmonic of the fundamental frequency, wherein the line stub is an unterminated circuit trace on a signal plane that is located below an outer insulating layer of the printed circuit board.

* * * * *